(12) United States Patent
Hong et al.

(10) Patent No.: US 7,927,910 B2
(45) Date of Patent: Apr. 19, 2011

(54) MANUFACTURING METHOD OF SOLAR CELL

(75) Inventors: Lu-Sheng Hong, Taipei (TW); Wen-Ching Hsu, Hsinchu (TW); Szu-Hua Ho, Hsinchu (TW)

(73) Assignees: Sino-American Silicon Products Inc., Hsinchu (TW); Lu-Sheng Hong, Taipei (TW)

( * ) Notice: Subject to any disclaimer, the term of this patent is extended or adjusted under 35 U.S.C. 154(b) by 19 days.

(21) Appl. No.: 12/493,209

(22) Filed: Jun. 28, 2009

(65) Prior Publication Data

US 2010/0330730 A1  Dec. 30, 2010

(51) Int. Cl.
*H01L 21/00* (2006.01)

(52) U.S. Cl. ............... 438/72; 438/609; 438/98; 438/46; 438/47; 438/29; 257/E21.158; 257/E31.127; 257/95

(58) Field of Classification Search .................... 438/72, 438/98, 609, 46, 47, 29; 257/E21.158, E31.127, 257/95
See application file for complete search history.

(56) References Cited

U.S. PATENT DOCUMENTS 6,791,117 B2 * 9/2004 Yoshitake et al. ............... 257/94
2004/0200520 A1 * 10/2004 Mulligan et al. ............... 136/256

* cited by examiner

*Primary Examiner* — Jarrett J Stark
*Assistant Examiner* — Wilner Jean Baptiste
(74) *Attorney, Agent, or Firm* — Jackson IPG PLLC; Demian K. Jackson

(57) ABSTRACT

The present invention discloses a method of manufacturing a solar cell by forming two electrode layers on the same side of a wafer, and avoiding sunlight incident to another side from being blocked by the electrode layers to enhance the photo-electric conversion efficiency, and each electrode layer is formed by using a mask layer to perform a vapor deposition process, without requiring any mask lithography or etching process. Of course, the issue of a high-temperature process that deteriorates the quality of the wafer no longer exists.

17 Claims, 12 Drawing Sheets

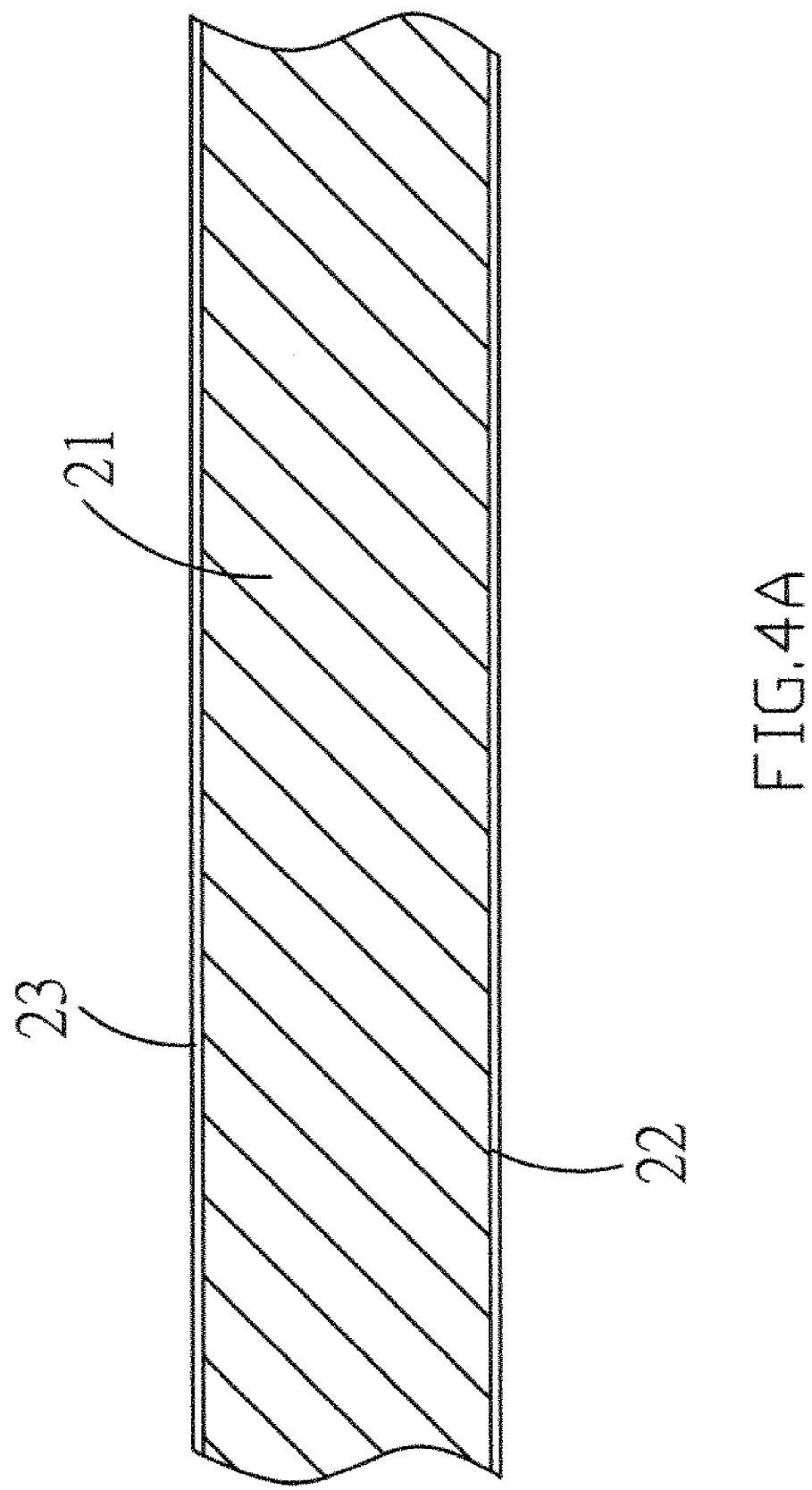

US 7,927,910 B2

MANUFACTURING METHOD OF SOLAR CELL

BACKGROUND OF THE INVENTION (a) Field of the Invention

The present invention relates to a manufacturing method of solar cells, in particular to a method of manufacturing solar cell electrodes by a vapor deposition process without requiring any mask lithography or etching process.

(b) Description of the Prior Art

At present, a widely used solar cell is designed with a p/n junction formed near a top side (which is a light receiving surface) of the solar cell, such that an electron stream can be produced when the solar cell absorbs light energy. In a general design of solar cells, a first group of electric contacts 12 are disposed at a top side 11 of a wafer 1, and a second group of electric contacts 13 disposed at a bottom side 14 of the wafer 1 as shown in FIG. 1. In a typical photoelectric module, these solar cells are electrically connected in series to increase voltage, and the connection is generally accomplished by soldering a conduction band from the top side of a certain solar cell to the bottom side of an adjacent solar cell.

In another type of solar cell structure which is called back-contact silicon solar cell structure as shown in FIG. 2, two groups of electric contacts 12, 13 are designed at the bottom side 14 of the wafer 1. Compared with a traditional silicon solar cell, the back-contact silicon solar cell has the following advantages. Firstly, the back-contact cell has higher conversion efficiency, since the loss of a contact shield is reduced or eliminated (because the sunlight reflected from a grating of the contact cannot be converted into electric power). Secondly, the back-contact cell has an electric circuit that can be produced easily, and thus the cost is low, since the two electrode contacts are formed on the same surface. In an example, a photoelectric module and a solar cell circuit adopted by the back-contact cell can be packaged in a single procedure to achieve the effect of saving cost significantly, compared with the present existing ways of assembling photoelectric modules. Finally, the back-contact cell provides a uniform appearance and a better aesthetic effect which is one of the important factors for a certain application such as a photoelectric system of a building and a foldable photoelectric roof of a car, etc.

In a general manufacturing method of a back-contact cell, mask lithography and etching processes are performed to the bottom side of a wafer for several times to form a p+type (boron) area and an n+type (phosphorous) area and electrodes on a back-sided end by screen printing, and the method includes performing the processes such as mask manufacture, exposure, development and etching for several times. Such method not only involves complicated processes, but also incurs a high cost for the mask manufacturing process. Furthermore, the temperature required for a thermal diffusion treatment is approximately equal to 600~800□ after the screen printing takes place, and such high-temperature process affects the quality of silicon wafer adversely.

SUMMARY OF THE INVENTION

It is a primary objective of the present invention to provide a manufacturing method of a solar cell, wherein a solar cell junction and an electrode are manufactured by a vapor deposition process without requiring any mask lithography or etching process.

More specifically, two electrode layers of the solar cell of the present invention are disposed on the same side of the wafer, and sunlight incident into another side of the wafer will not be blocked by the electrode layers, so that the photoelectric conversion efficiency can be improved. In addition, each electrode layer is formed by using a mask layer to perform a vapor deposition process without requiring any mask lithography or etching process. Of course, the issue of a high-temperature process that deteriorates the quality of the wafer no longer exists.

DETAILED DESCRIPTION OF THE PREFERRED EMBODIMENTS

Figure 1:
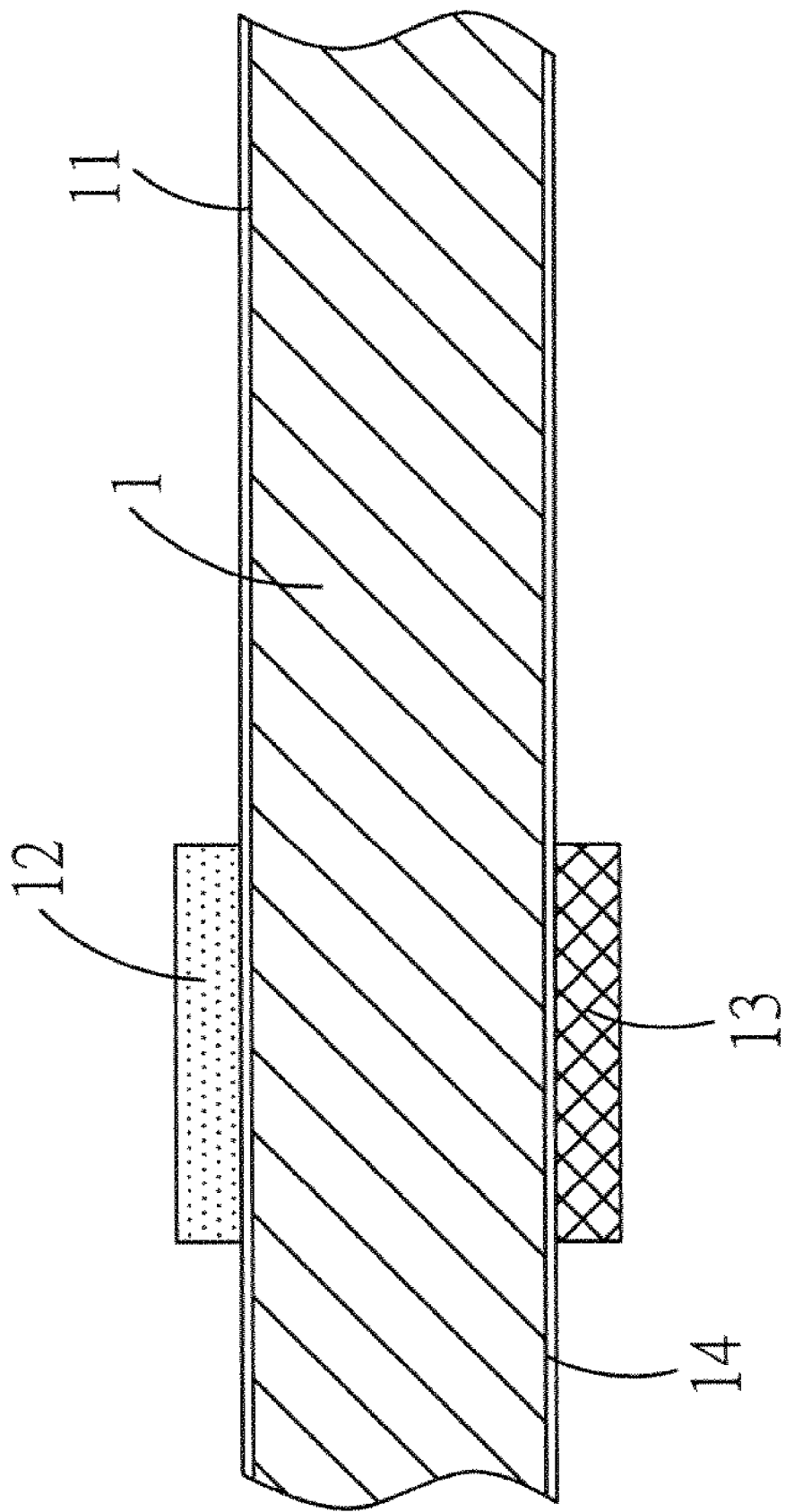
FIG. 1 is a schematic view of a conventional solar cell structure.
Figure 2:
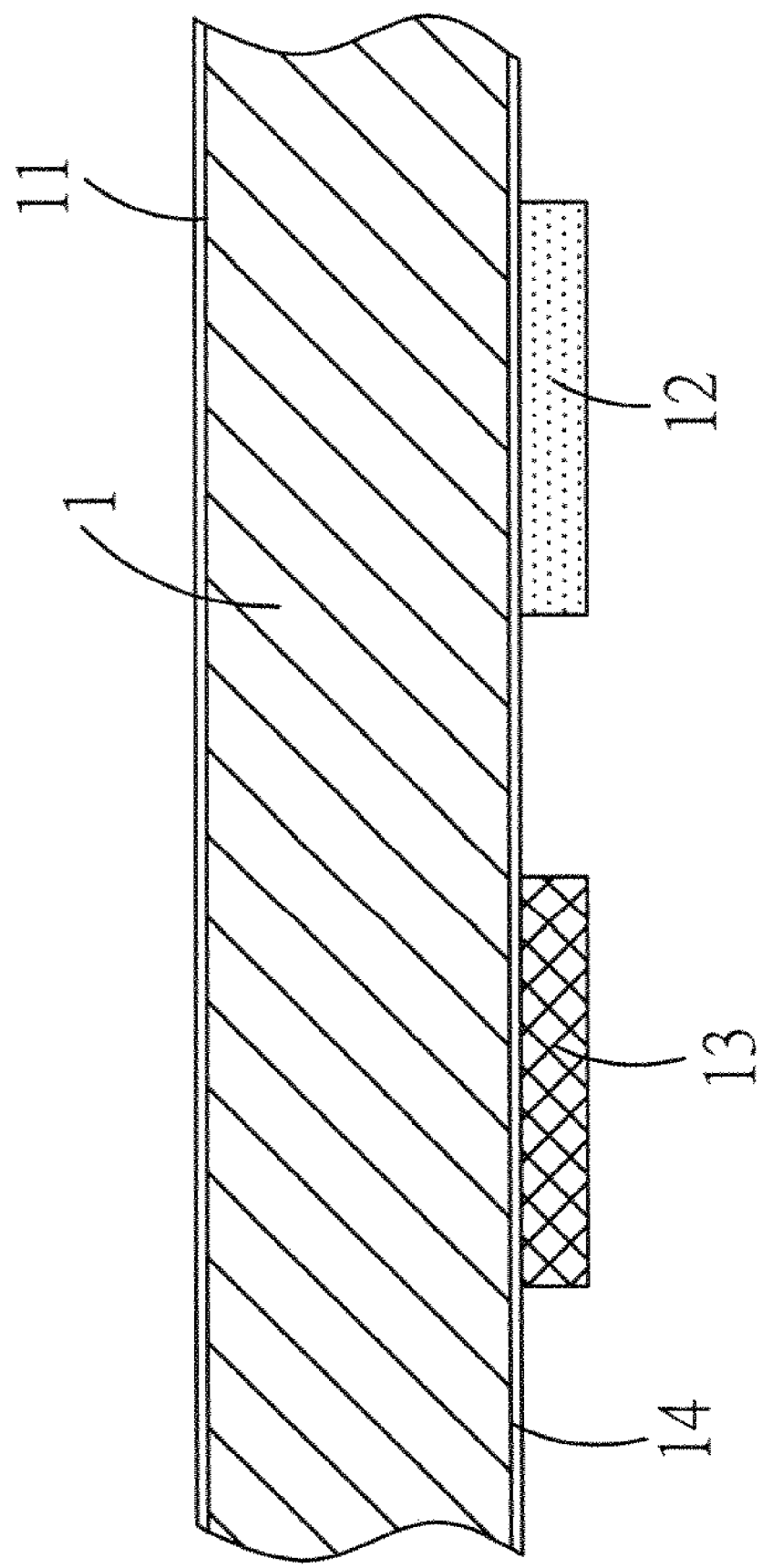
FIG. 2 is a schematic view of a conventional back-contact solar cell structure.
Figure 3:
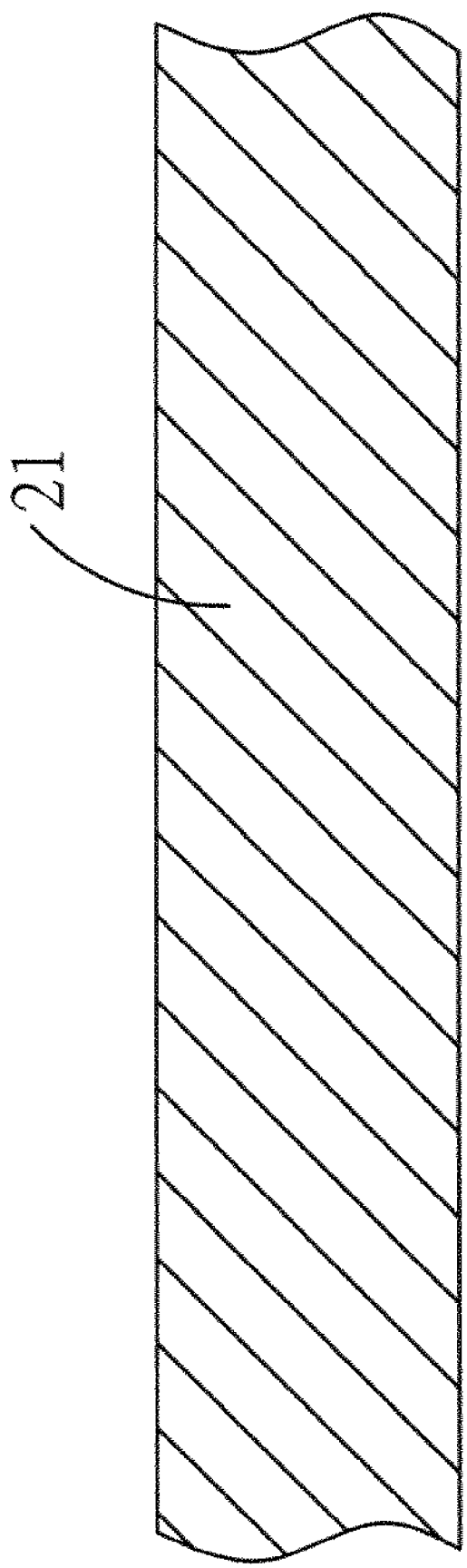
FIGS. 3 to 10 show a flow chart of a manufacturing method of a solar cell in accordance with the present invention step by step.

The manufacturing method of a solar cell in accordance with the present invention comprises the following steps:

Step A: Provide a wafer 21 as shown in FIG. 3, wherein the wafer 21 is an n-type monosilicon wafer or a p-type monosilicon wafer.

Figure 4B:
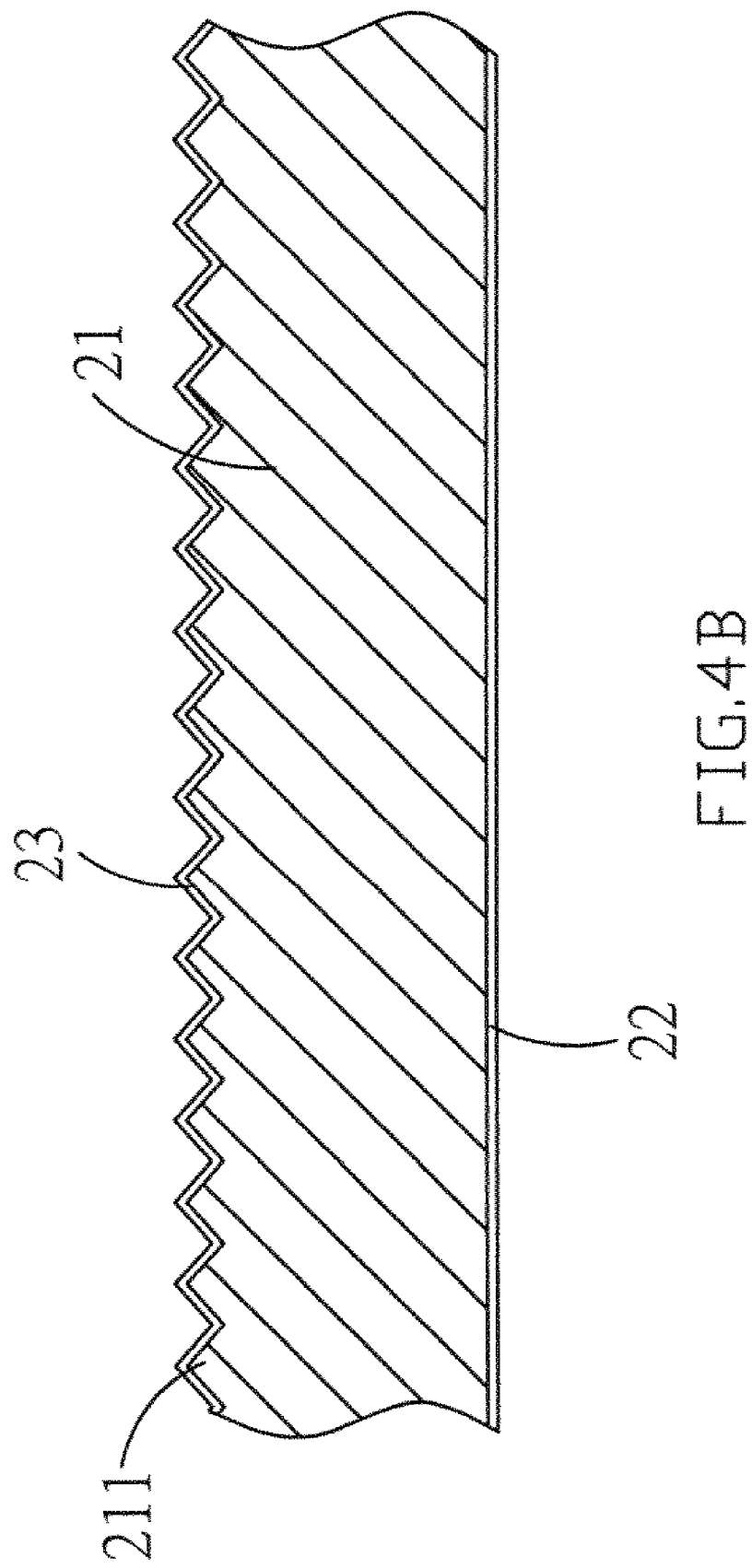

Step C1: Form first and second passivation layers 22, 23 on a bottom side and a top side of the wafer 21 respectively as shown in FIG. 4A, wherein the first and second passivation layers 22, 23 are super thin, and whose thickness is approximately equal to 30~50 Å, and the first passivation layer 22 is formed by depositing an amorphous silicon material or a carbon, nitrogen, or oxygen doped material on the bottom side of the wafer 21, and the second passivation layer 23 is formed by depositing a silicon oxide or a amorphous silicon doped material on the top side of the wafer 21. Of course, a Step C2 can be included between the Step A and the Step C1, wherein the Step C2 forms a wavy-shaped microstructure 211 on the top side of the wafer 21 as shown in FIG. 4B, and the microstructure 211 is formed by a wet etching process or a dry etching process, and then the Step C1 forms first and second passivation layers 22, 23. The following procedure is demonstrated in FIG. 4B.

Figure 5:
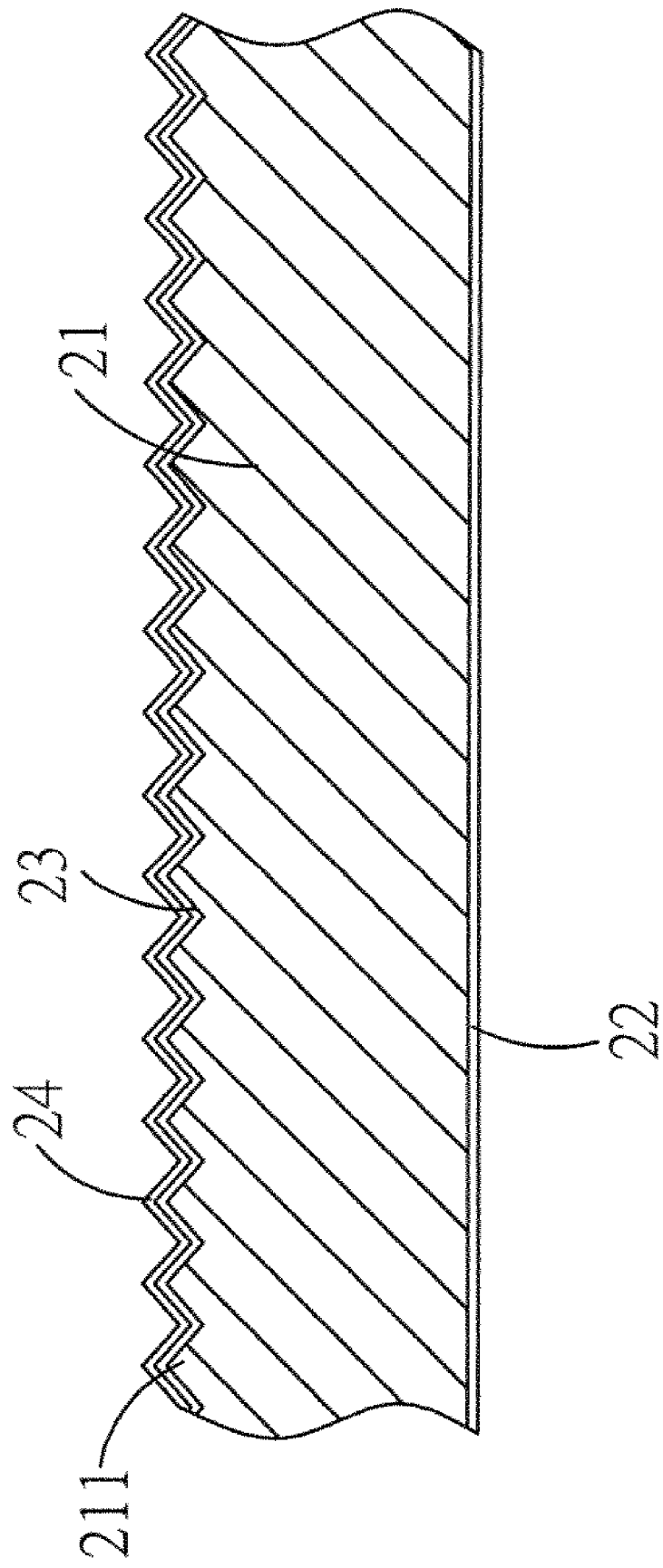

Step D: Deposit an anti-reflective protecting layer 24 on a surface of the second passivation layer 23 as shown in FIG. 5. Of course, both of the second passivation layer 23 and the anti-reflective protecting layer 24 can be in the wavy shape, and the anti-reflective protecting layer 24 can be made of silicon nitride.

Figure 6A:
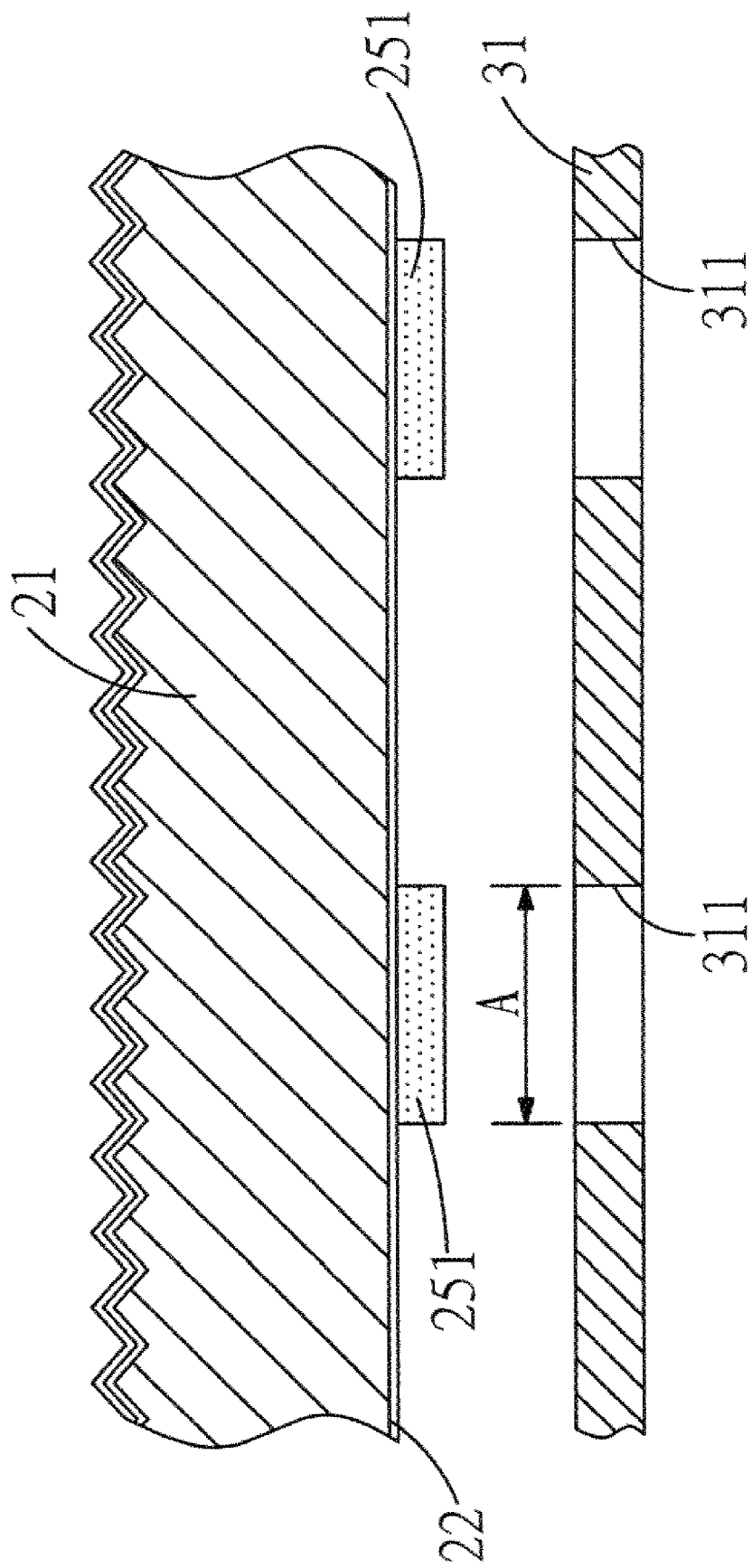

Step B: Perform a vapor deposition process to a side of the wafer, and the Step B comprises the following steps:

Step B1: Use a first mask layer 31 to perform a first-time vapor deposition as shown in FIG. 6A, wherein the first mask layer 31 includes a plurality of first apertures 311. Deposit a first electrode base 251 (such as a p+ emitter area) onto a bottom side of the wafer 21 by a plasma enhanced chemical vapor deposition with a boron-doped concentration of 1019-1021/cm$^3$, wherein the first electrode base 251 has a thickness of 50~300 Å.

Figure 6B:
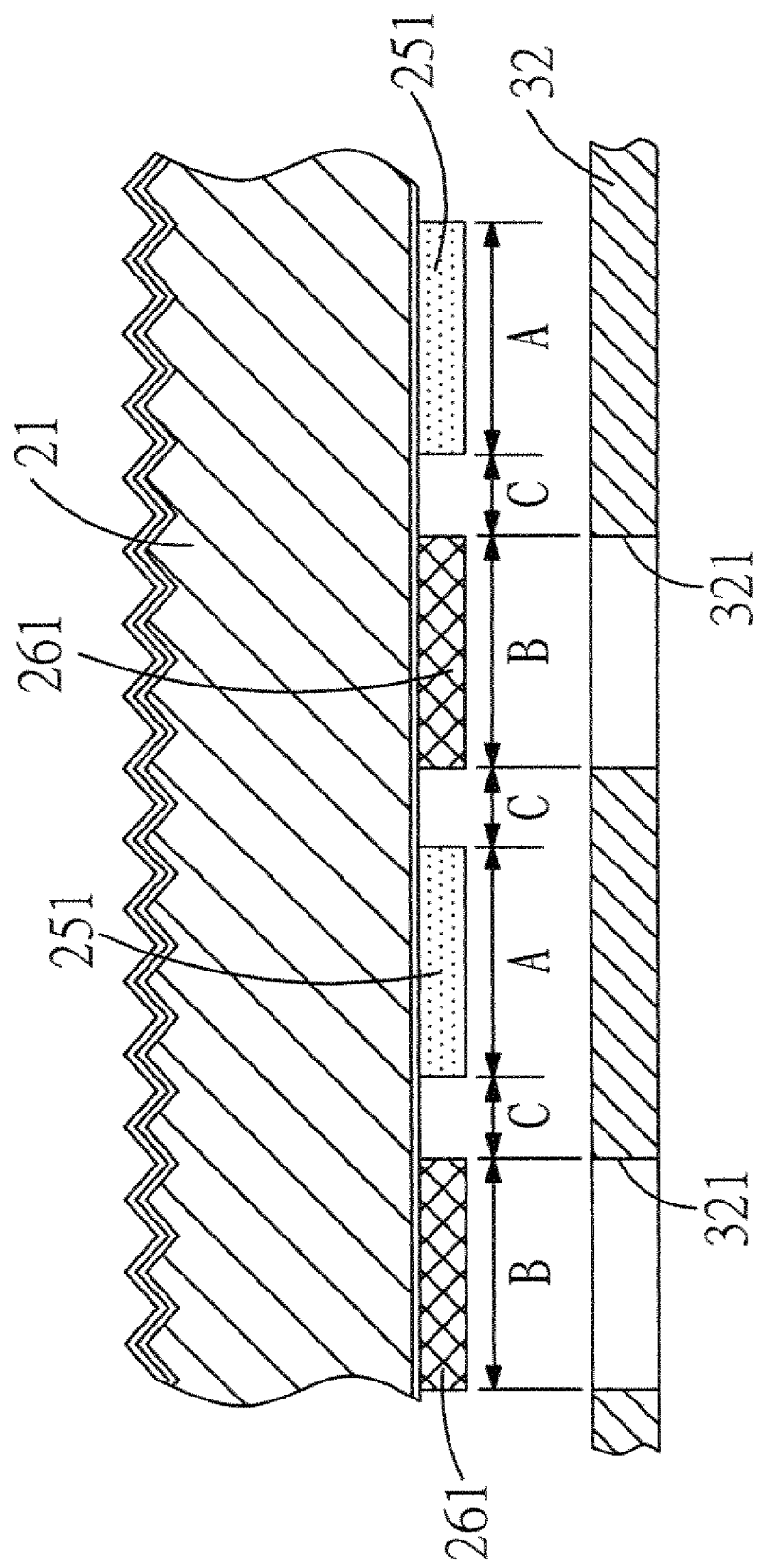

Step B2: Use a second mask layer 32 to perform a second-time vapor deposition as shown in FIG. 6B, wherein the second mask layer 32 includes a plurality of second apertures 321. Deposit a second electrode base 261 (such as n+ back surface field area) adjacent to the first electrode base 251 by a plasma enhanced chemical vapor deposition with a phosphorous-doped concentration of 1019-1021 cm$^3$, wherein the second electrode base 261 has a thickness of 100~500 Å and the aperture ratio of the first and second mask layers 31, 32 is determined by an interval between the first and second electrode bases 251, 261. With reference to FIGS. 6A and 6B, the aperture ratio of the first aperture 311 is A, which means that the length of each first electrode base 251 is equal to A after the deposition takes place, and the aperture ratio of the second aperture 321 is B, which means that the length of each second electrode base 261 is equal to B after the deposition takes place. Now, the distance between the two first electrode bases 251 minus the length B of the second electrode base 261 is equal to twice of the interval C between the first and second electrode bases 251, 261. Therefore, the larger the length or the aperture ratio B, the smaller is the interval C. On the other hand, the smaller the length or the aperture ratio B, the larger is the interval C.

Figure 7:
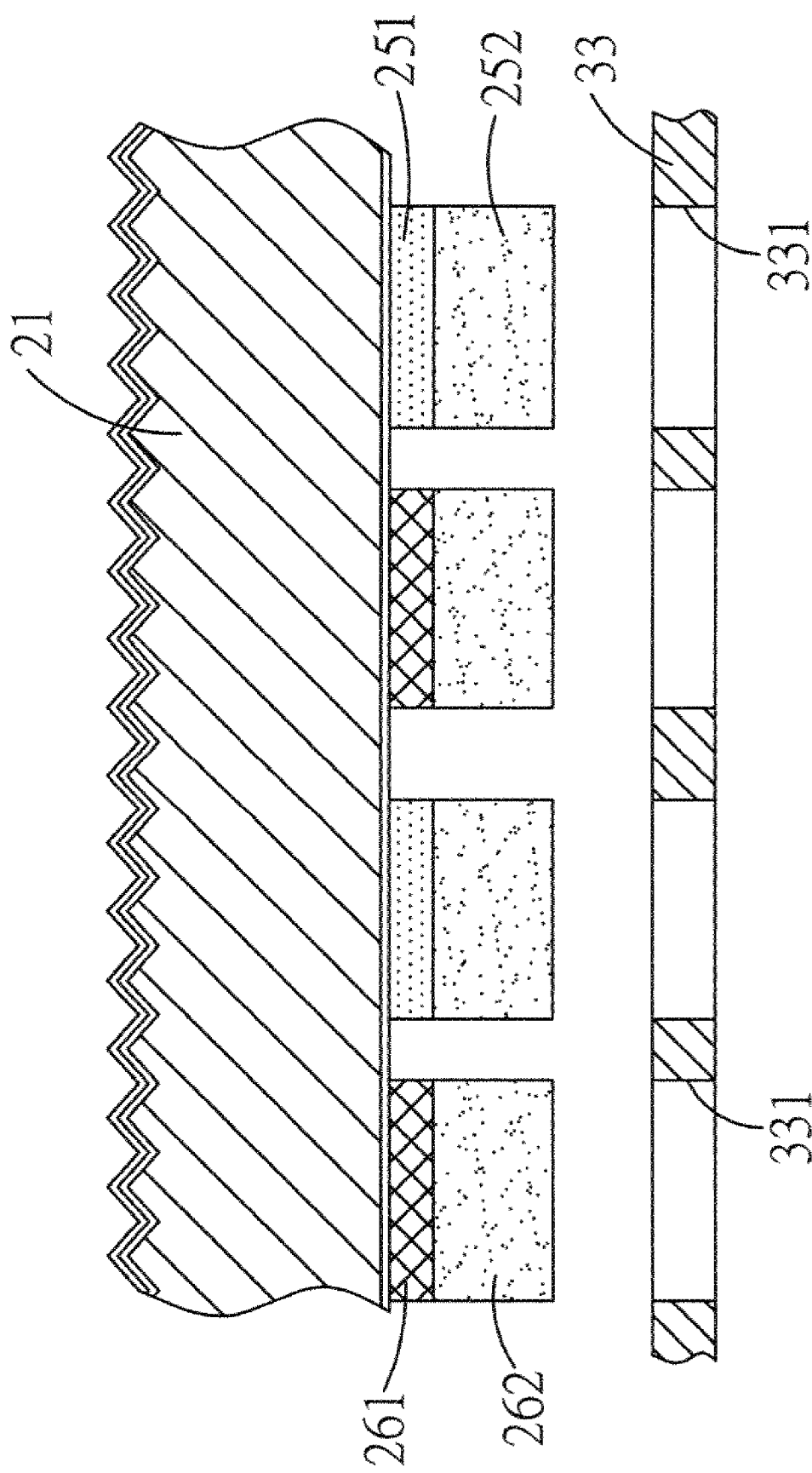

Step B3: Use a third mask layer 33 to form first and second conductive transparent oxide layers 252, 262 made of indium tin oxide on top of the first and second electrode bases 251, 261 respectively as shown in FIG. 7, wherein the third mask layer 33 has a third aperture 331 disposed at a position opposite to each of the first and second electrode bases 251, 261 and provided for forming indium tin oxide on top of the first and second electrode bases 251, 261 by a splattering method or a co-evaporation method, and the conductive transparent oxide layer has a thickness of 800~1000 Å.

Figure 8:
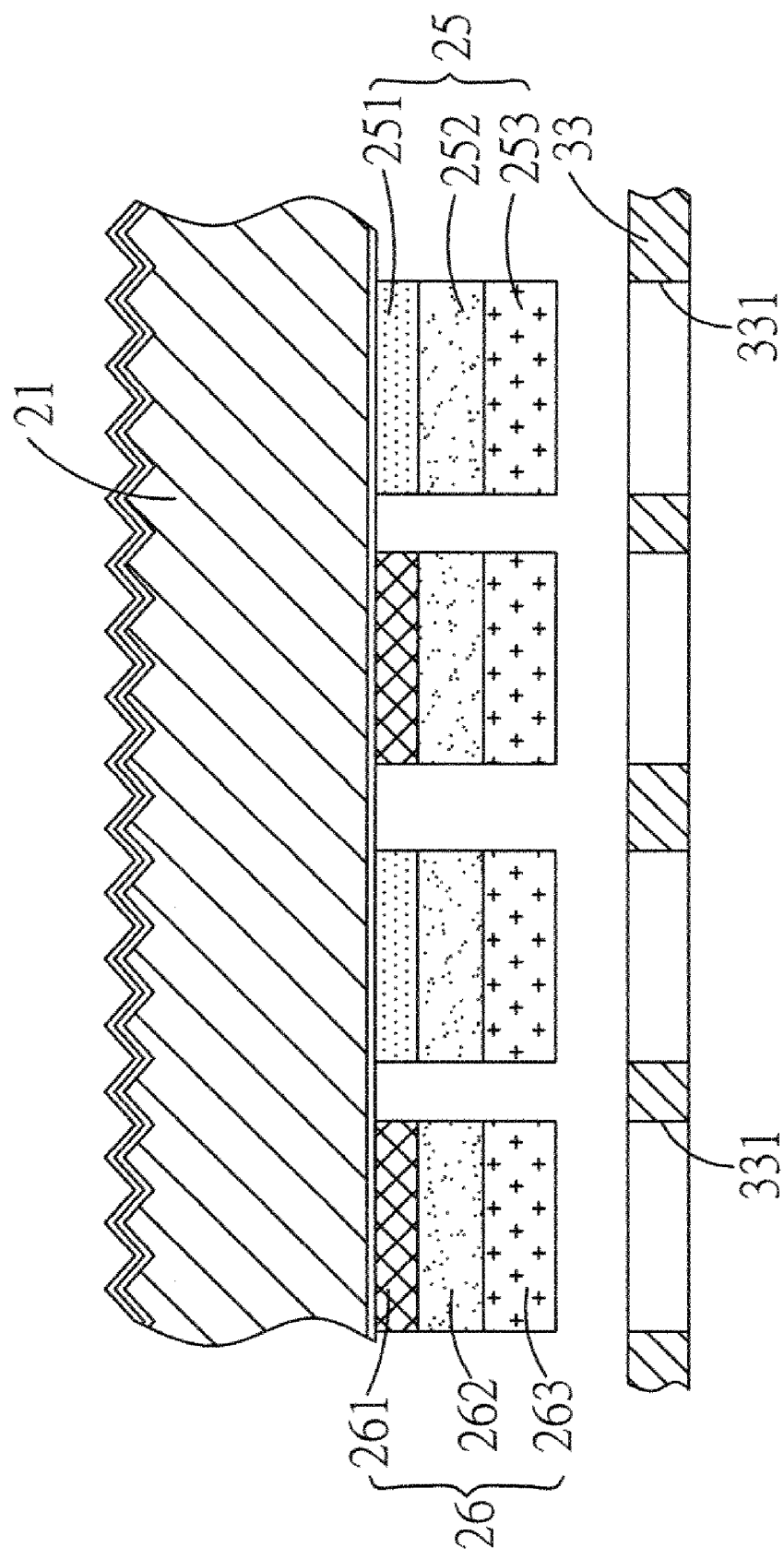

Step B4: Similarly, use a third mask layer 33 to form first and second metal electrodes 253, 263 on top of the first and second conductive transparent oxide layers 252, 262 respectively as shown in FIG. 8. Deposit a metal such as silver and aluminum onto the first and second conductive transparent oxide layers 252, 262 respectively by a vapor deposition, a screen printing, or an ink-jet printing method without requiring a mask layer, so that a first conductive transparent oxide layer 252 and a first metal electrode 253 are sequentially formed on top of the first electrode base 251 to constitute the first electrode layer 25, and a second conductive transparent oxide layer 262 and a second metal electrode 263 are formed sequentially on top of the second electrode base 261 to constitute the second electrode layer 26.

Figure 9:
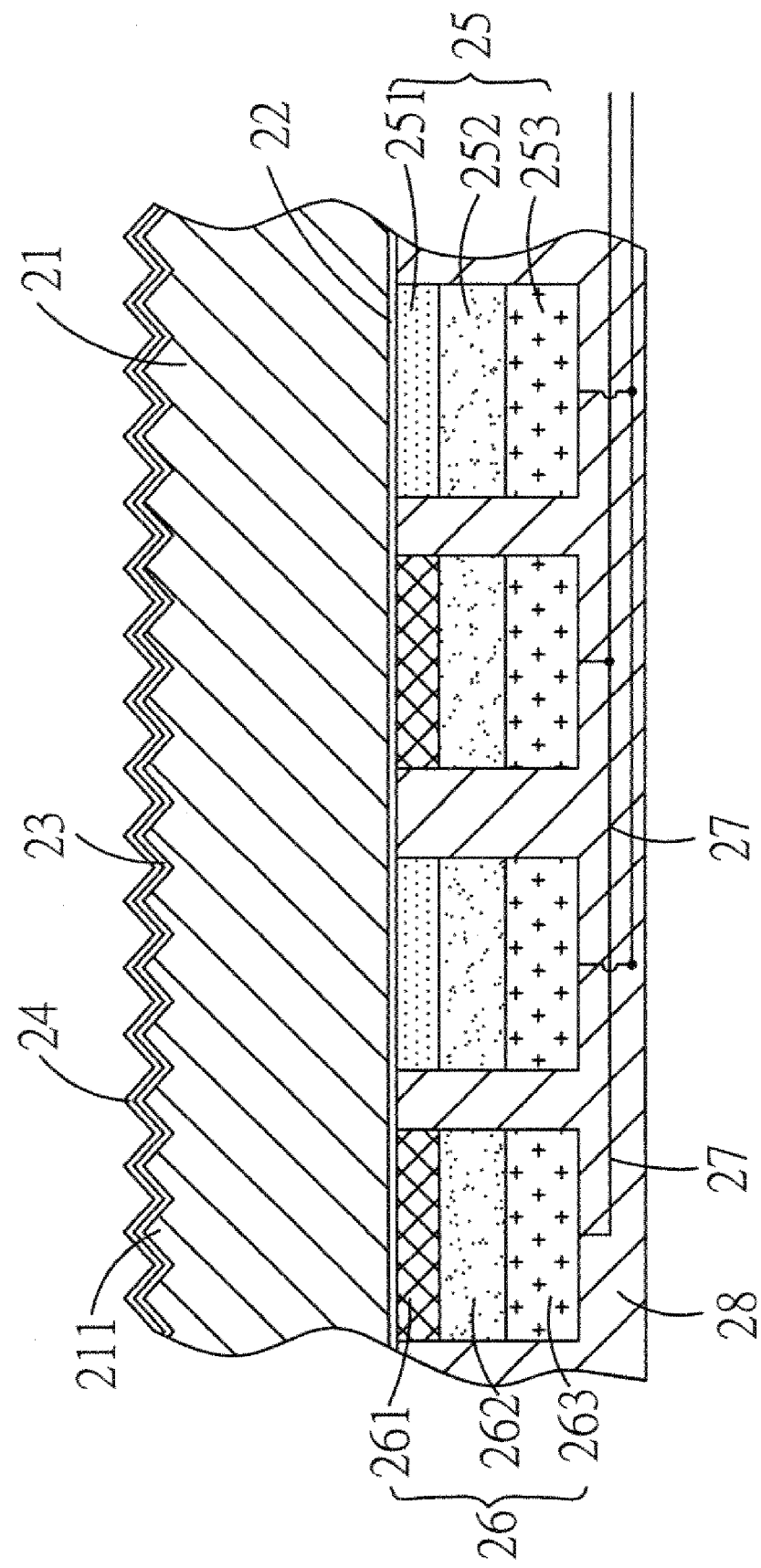
Figure 10:
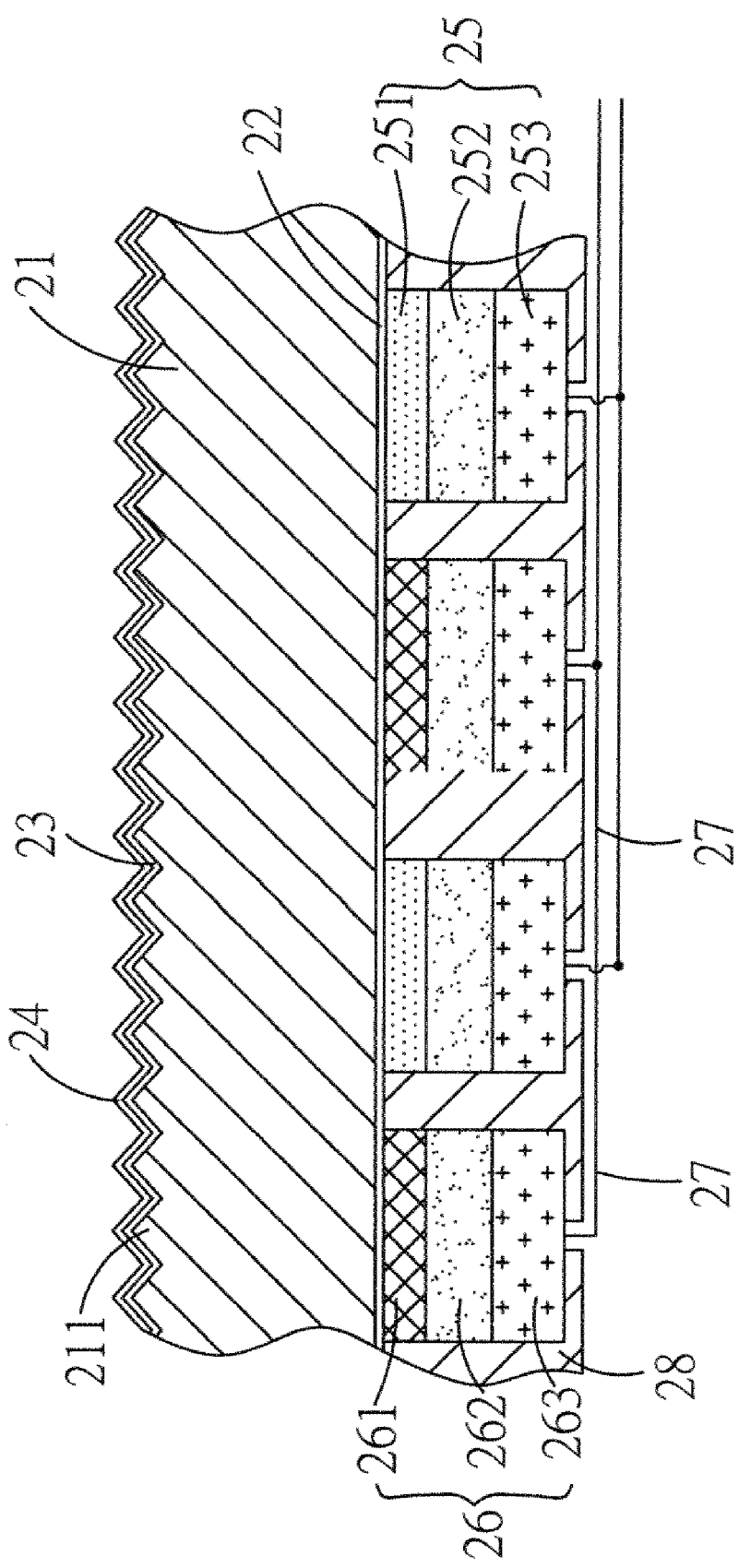

Step E1: Connect a conductive wire 27 to the first and second electrode layers 25, 26 separately, and form an insulating layer 28 on the bottom side of the wafer 21 as shown in FIG. 9, wherein the insulating layer 28 made of silicon oxide or silicon nitride is formed on the wafer 21 by a vapor deposition process to cover the first and second electrode layers 25, 26 and expose the conductive wire 27, so as to complete the structure of the solar cell 2. Of course, a Step E2 can be included after the Step B3 takes place, and the Step E2 forms the insulating layer 28 on the wafer 21 as shown in FIG. 10 to partially cover the first and second electrode layers 25, 26, and a conductive wire 27 is connected the exposed portion of the first and second electrode layers 25, 26 separately to form a complete structure of the solar cell 2 in a similar way.

It is noteworthy to point out that the present invention applies a vapor deposition process (such as a plasma enhanced chemical vapor deposition) and performs the vapor deposition for at least two times to facilitate depositing first and second electrode layers (which can be the n+type amorphous silicon and the p+type amorphous silicon of the base and the metal electrode thereon) onto the bottom side of the wafer, wherein the present invention has the following advantages over the prior art:

1. Each electrode layer is disposed at the bottom side of the wafer, so that the sunlight incident into the top side of the wafer will not be blocked by the electrode layer to enhance the photoelectric conversion efficiency.

2. The manufacturing method of the present invention does not require any mask lithography or etching process, but the manufacture can be achieved by a mask layer (which is made of a metal or a polymer material) by a vapor deposition process. Therefore, the invention can save the cost of manufacturing the masks for several times, and waive the exposure, development and etching process. Of course, the invention does not require any chemicals including photoresist, photoresist stripper and developer which are harmful to the environment.

3. The temperature required for the vapor deposition process of the present invention is below 400□ (approximately equal to 200□), and thus the issue of a high-temperature process that deteriorates the quality of the wafer not longer exists.

4. The passivation layers are deposited onto the top side and the bottom side of the wafer respectively to reduce defects occurred at an interface between the crystalline silicon (wafer) and the amorphous silicon (electrode layer), so as to enhance the conversion efficiency of the solar cell.

5. The first and second electrode layers are separated by a passivation layer, so that a PIN structure is formed between the first and second electrode layers to produce a built-in electric field, which helps separating and moving electrons and electron-hole pairs produced after the wafer to absorb the sunlight onto the first and second electrode layers (or n+type and p+type amorphous silicon).

6. The wavy shaped microstructure formed on the top side of the wafer can improve the light incidence rate, and the anti-reflective protecting layer on the surface of the microstructure can reduce the reflectivity to enhance the photoelectric conversion efficiency.

While the invention has been described by means of specific embodiments, numerous modifications and variations could be made thereto by those skilled in the art without departing from the scope and spirit of the invention set forth in the claims.

We claim:

1. A manufacturing method of a solar cell, and the solar cell comprising a wafer, and first and second electrode layers having a different polarity from one another, and the manufacturing method forming a base portion of the two electrode layers on a same side of the wafer by a vapor deposition process, and the two electrode layers having an interval apart,
wherein the vapor deposition process includes a first mask layer, and the first mask layer includes a plurality of first apertures, and the first mask layer is placed on a side of the wafer for performing a vapor deposition process, such that the wafer includes a first electrode base disposed at a position opposite to each first aperture of the first mask layer,
wherein the wafer is formed on the same side of the first electrode base, and a second mask layer having a plurality of second apertures is used for depositing a second electrode base adjacent to the first electrode base
wherein the first apertures are not juxtaposed with the second apertures with respect to the wafer.

2. The manufacturing method of a solar cell as recited in claim 1, wherein each electrode layer is disposed on a bottom side of the wafer.

3. The manufacturing method of a solar cell as recited in claim 2, wherein the wafer includes a wavy shaped microstructure formed on a top side of the wafer.

4. The manufacturing method of a solar cell as recited in claim 3, wherein the microstructure includes a second passivation layer disposed on a surface of the microstructure.

5. The manufacturing method of a solar cell as recited in claim 4, wherein the second passivation layer includes an anti-reflective protecting layer disposed on a surface of the second passivation layer.

6. The manufacturing method of a solar cell as recited in claim 1, wherein the first and second electrode layers include a plurality of first and second electrode bases, first and second conductive transparent oxide layers, and first and second metal electrodes respectively, and each metal electrode is disposed on top of each respective conductive transparent oxide layer.

7. The manufacturing method of a solar cell as recited in claim 6, wherein the first electrode bases and the second electrode bases are arranged with an interval apart from each other.

8. A manufacturing method of solar cell, and the solar cell comprising a wafer, and the manufacturing method comprising the steps of:

performing a vapor deposition process to a side of the wafer for at least two times to form first and second electrode layers having a different polarity from one another on a same side of the wafer same side, and each vapor deposition process using a mask layer with a plurality of apertures for the vapor deposition process, and each mask layer having an aperture ratio determined by an interval between the first and second electrode layers, wherein the vapor deposition process includes a first mask layer, and the first mask layer includes a plurality of first apertures, and the first mask layer is placed on a side of the wafer for performing a vapor deposition process, such that the wafer includes a first electrode base disposed at a position opposite to each first aperture of the first mask layer, wherein the wafer is formed on the same side of the first electrode base, and a second mask layer having a plurality of second apertures is used for depositing a second electrode base adjacent to the first electrode base, wherein the first apertures are not juxtaposed with the second apertures with respect to the wafer.

9. The manufacturing method of a solar cell as recited in claim 8, wherein the first and second electrode layers include a plurality of first and second electrode bases, first and second conductive transparent oxide layers and first and second metal electrodes respectively, and each metal electrode is installed on top of each respective conductive transparent oxide layer.

10. The manufacturing method of a solar cell as recited in claim 9, wherein the first electrode bases and the second electrode bases are arranged with an interval from one another.

11. A manufacturing method of a solar cell, comprising the steps of:
 (A) providing a wafer;
 (B) performing a vapor deposition process to a side of the wafer, wherein the vapor deposition process includes performing a vapor deposition twice to facilitate depositing the first and second electrode layers on the same side of the wafer, and the two electrode layers have an interval apart,
  wherein the first and second electrode layers comprise a plurality of first and second electrode bases, first and second conductive transparent oxide layers, and first and second metal electrodes respectively, and the Step B comprising the steps of:
 (B1) using a first mask layer to perform a first-time vapor deposition, for depositing a first electrode base onto a bottom side of the wafer;
 (B2) using a second mask layer to perform a second-time vapor deposition, for depositing a second electrode base adjacent to the first electrode base;
 (B3) using a third mask layer to form first and second conductive transparent oxide layers on top of the first and second electrode bases respectively; and
 (B4) similarly, using a third mask layer to form first and second metal electrodes on top of the first and second conductive transparent oxide layers respectively,
  wherein the first apertures are not juxtaposed with the second apertures with respect to the wafer.

12. The manufacturing method of a solar cell as recited in claim 11, wherein the wafer is an n-type monosilicon wafer.

13. The manufacturing method of a solar cell as recited in claim 11, further comprising a Step C1 between the Step A and the Step B, and the Step C1 forming first and second passivation layers on a bottom side and a top side of the wafer respectively.

14. The manufacturing method of a solar cell as recited in claim 13, further comprising a Step D between the Step C1 and the Step B, and the Step D depositing an anti-reflective protecting layer on a surface of the second passivation layer.

15. The manufacturing method of a solar cell as recited in claim 11, further comprising a Step C2 and a Step C1 arranged sequentially between the Step A and the Step B, and the Step C2 forming a wavy-shaped microstructure on a top side of the wafer, and the Step C1 forming first and second passivation layers on microstructures at a bottom side and a top side of the wafer respectively.

16. The manufacturing method of a solar cell as recited in claim 11, wherein the Step B3 forms first and second conductive transparent oxide layers by a splattering or co-evaporation method.

17. The manufacturing method of a solar cell as recited in claim 11, wherein the Step B4 forms first and second metal electrode by using a vapor deposition, a screen printing or an ink-jet printing method.

\* \* \* \* \*